United States Patent
Meijer et al.

(10) Patent No.: US 7,426,015 B2
(45) Date of Patent: Sep. 16, 2008

(54) DEVICE MANUFACTURING METHOD AND LITHOGRAPHIC APPARATUS

(75) Inventors: Hendricus Johannes Maria Meijer, Veldhoven (NL); Michael Jozef Mathijs Renkens, Sittard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/654,037

(22) Filed: Jan. 17, 2007

(65) Prior Publication Data

US 2008/0170210 A1 Jul. 17, 2008

(51) Int. Cl.
G03B 27/42 (2006.01)
G03B 27/54 (2006.01)

(52) U.S. Cl. ............... 355/53; 355/67; 355/71; 355/77; 378/34

(58) Field of Classification Search ............ 355/30, 355/53, 67, 72, 71, 77; 378/34, 35
See application file for complete search history.

(56) References Cited

U.S. PATENT DOCUMENTS

| | | | | |
|---|---|---|---|---|
| 4,825,247 A | * | 4/1989 | Kemi et al. | 355/55 |
| 6,545,746 B1 | * | 4/2003 | Nishi | 355/53 |
| 6,870,598 B2 | * | 3/2005 | Nishi | 355/30 |
| 7,130,016 B2 | * | 10/2006 | Miyajima | 355/30 |
| 2003/0025889 A1 | * | 2/2003 | Hasegawa et al. | 355/30 |
| 2004/0035570 A1 | | 2/2004 | Hara et al. | 165/289 |
| 2005/0054217 A1 | | 3/2005 | Klomp et al. | 438/795 |
| 2006/0007413 A1 | | 1/2006 | Nanba | 355/30 |
| 2006/0126041 A1 | * | 6/2006 | Van Dijsseldonk et al. | 355/53 |
| 2006/0175558 A1 | | 8/2006 | Bakker et al. | 355/53 |
| 2006/0176455 A1 | * | 8/2006 | Nomoto | 355/53 |

FOREIGN PATENT DOCUMENTS

| EP | 1 376 239 A2 | 1/2004 |
|---|---|---|
| WO | 2005/010617 A2 | 2/2005 |
| WO | 2005/101122 A2 | 10/2005 |

OTHER PUBLICATIONS

International Search Report and Written Opinion for International Application No. PCT/IB2008/050160 dated Jul. 1, 2008.

* cited by examiner

*Primary Examiner*—Della J. Rutledge
(74) *Attorney, Agent, or Firm*—Pillsbury Winthrop Shaw Pittman, LLP

(57) ABSTRACT

A device manufacturing method includes bringing pressure within a vacuum chamber of a lithographic projection apparatus to a temperature stabilizing pressure range; keeping the pressure within the vacuum chamber within the temperature stabilizing pressure range for a period of time so as to stabilize the temperature in the vacuum chamber; decreasing the pressure within the vacuum chamber to a production pressure range; generating a beam of radiation with a radiation system; patterning the beam of radiation; and projecting the patterned beam of radiation through the vacuum chamber onto a target portion of a layer of radiation-sensitive material on a substrate.

31 Claims, 1 Drawing Sheet

DEVICE MANUFACTURING METHOD AND LITHOGRAPHIC APPARATUS

FIELD

The present invention relates to a device manufacturing method and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the wafer may be limited by the wavelength of the projection radiation. To produce integrated circuits with a higher density of devices and hence higher operating speeds, it is desirable to be able to image smaller features. While most current lithographic projection apparatus employ ultraviolet light generated by mercury lamps or excimer lasers with a wavelength larger or equal to 193 nm, it has been proposed to use shorter wavelength radiation of around 13 nm. Such radiation is termed extreme ultraviolet (EUV) or soft x-ray, and possible sources include laser-produced plasma sources, discharge plasma sources or synchrotron radiation from electron storage rings. Other proposed radiation types include electron beams and ion beams.

When using electron or ion beams, or EUV, the beam path, including the mask, substrate and optical components, should be kept in a vacuum to prevent absorption and/or scattering of the beam. A total pressure of less than about $10^{-6}$ mbar may be used for electron and ion beams. Optical elements for EUV radiation can be spoiled by the deposition of carbon layers on their surface, so hydrocarbon partial pressures should generally be kept as low as possible, and layers of carbon from the mirrors may need to be cleaned from the mirrors from time to time. For a lithographic apparatus using EUV radiation, the total vacuum pressure may be higher than the pressure used for electron and ion beams, which would typically be considered a rough vacuum.

To be able to image the mask onto the substrate, a projection system is used which in the case of EUV may comprise one or more mirrors held by a frame. The features that may be imaged by the projection system may be smaller than 100 nm and therefore the image is very sensitive to aberrations of the mirror and deformations of the frame. The deformations and aberrations may be caused by thermal fluctuations of the low expansion material that is used for the mirrors and the frame. The fluctuations may be caused by heating and or cooling of the projection system. Heating may occur during illumination of the mirror with EUV light and during cleaning of the mirrors with a relatively hot gas. Cooling may be caused by adiabatic expansion during pump down of the vacuum chamber.

Since the projection system is kept at a vacuum, cooling or heating of the mirror mainly occurs by radiation of heat to or from the vacuum wall of the apparatus and to other components within the vacuum environment. The transfer of energy out of or into the vacuum chamber by radiation takes a lot of time in which the lithographic projection apparatus may not be used.

SUMMARY

It is desirable to provide a method for transferring heat into or out of the vacuum chamber more quickly.

According to an aspect of the invention, there is provided a device manufacturing method that includes bringing pressure within a vacuum chamber of a lithographic projection apparatus to a temperature stabilizing pressure range; keeping the pressure within the vacuum chamber within the temperature stabilizing pressure range for a period of time so as to stabilize the temperature in the vacuum chamber; decreasing the pressure within the vacuum chamber to a production pressure range; generating a beam of radiation with a radiation system; patterning the beam of radiation; and projecting the patterned beam of radiation through the vacuum chamber onto a target portion of a layer of radiation-sensitive material on a substrate.

According to a further aspect of the invention there is provided a lithographic apparatus that includes an illumination system configured to condition a radiation beam, and a support constructed to support a patterning device. The patterning device is capable of imparting the radiation beam with a pattern in its cross-section to form a patterned radiation beam. The apparatus also includes a substrate table constructed to hold a substrate, a projection system configured to project the patterned radiation beam onto a target portion of the substrate, and a vacuum chamber constructed and arranged to provide a vacuum beam path to the radiation beam. The vacuum chamber is provided with a pump configured to evacuate the vacuum chamber, a purge system configured to purge the vacuum chamber, and a vacuum control system configured to control the pump and the purge system.

BRIEF DESCRIPTION OF THE DRAWINGS

Embodiments of the invention will now be described, by way of example only, with reference to the accompanying schematic drawing in which.

DETAILED DESCRIPTION

Figure 1:
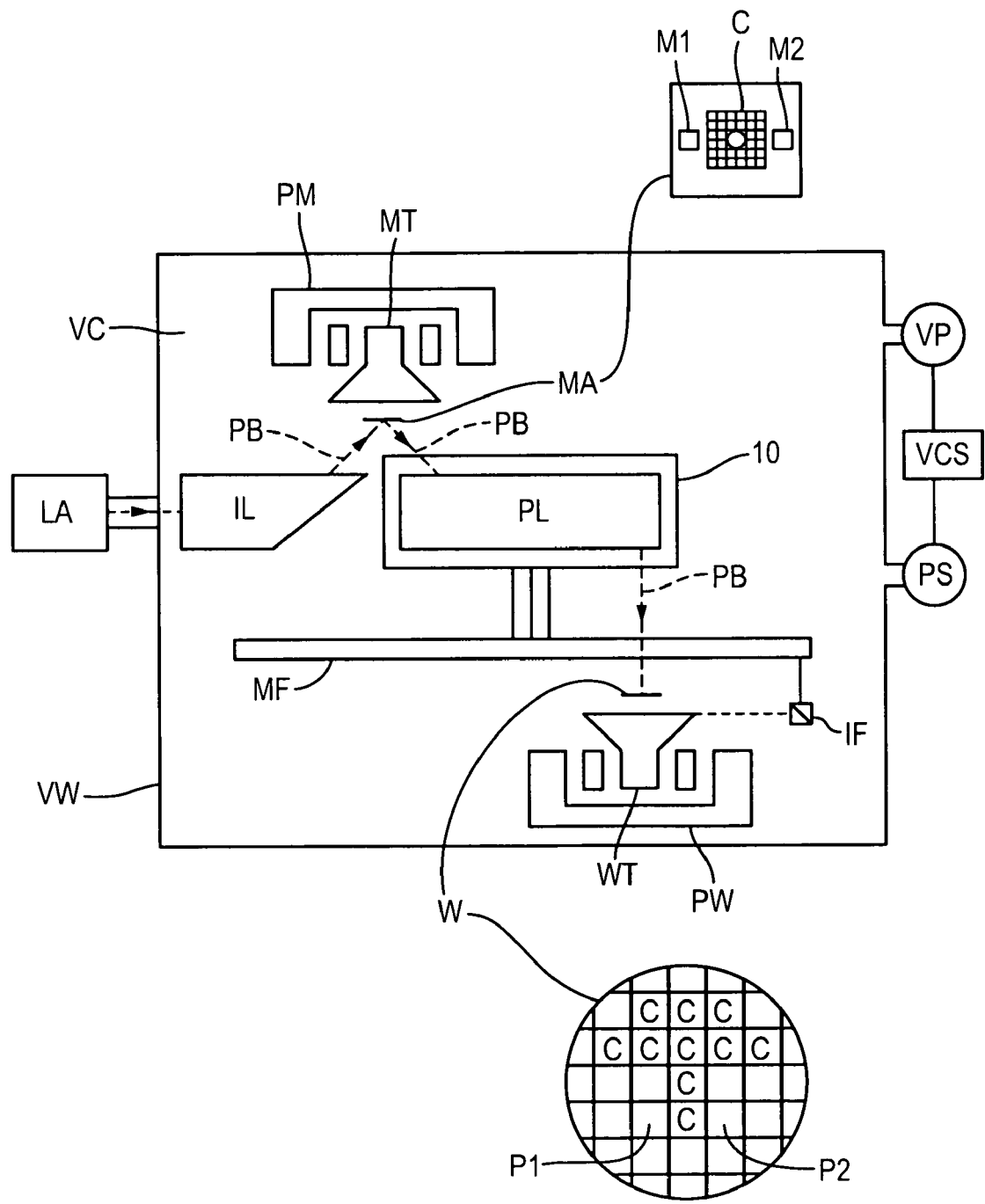
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam PB of e.g. UV or EUV radiation; a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT supports the patterning device MA. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure MT may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source LA. The source and the lithographic apparatus may be separate entities, for example when the source is an excimer laser. In such cases, the source is not considered to form part of the lithographic apparatus and the radiation beam is passed from the source LA to the illuminator IL with the aid of a beam delivery system comprising, for example, suitable directing mirrors and/or a beam expander. In other cases the source may be an integral part of the lithographic apparatus, for example when the source is a mercury lamp. The source LA and the illuminator IL, together with the beam delivery system if required, may be referred to as a radiation system. The source LA may be a EUV source that should be kept in vacuum as well.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

A so-called "metrology frame" MF, provides an isolated frame of reference, which is mechanically isolated from the main apparatus structure. Projection system PL is supported on the metrology frame MF. Projection system PL is partially surrounded by a shield structure 10.

The lithographic projection apparatus of the illustrated embodiment includes a vacuum chamber VC with a vacuum wall VW. In the vacuum chamber, the beam PB impinges on mask MA and subsequently onto the target area of the substrate W. The pressure within the vacuum chamber VC is regulated with a vacuum pump VP and a purge system PS, both of which are controlled by a vacuum control system VCS. The vacuum pump VP may be a turbo pump and the purge system may comprise one or more valves for purging the vacuum chamber with Helium, Hydrogen, Nitrogen, Argon or a mixture thereof. The vacuum control system VCS may be provided with a computer and may be provided with a connection to a pressure sensor for measuring the pressure within the vacuum chamber VC. This provides the possibility to regulate the pressure within the vacuum chamber VC with the vacuum pump VP and the purge system PS.

To bring the vacuum chamber into vacuum the vacuum pump VP may be started by the vacuum control system VCS. The temperature in the vacuum chamber may decrease by 2 degrees Celsius by adiabatic expansion of the gas in the vacuum chamber. The projection system PL and radiation system LA, IL, which may have sensitive mirrors, and the metrology frame MF may be sensitive to temperature changes and therefore the decrease in temperature should be compensated for before the lithographic apparatus can be used for exposure of substrates. One of the options is to pump the vacuum chamber VC down to the required production pressure range below about 0.1 mbar and to wait until the temperature of the vacuum chamber is stabilized again. Since not much medium is present in the vacuum to transport substantial heat from the vacuum walls VW to the components in the vacuum chamber VC by convection, the heat is transferred by radiation from the vacuum walls VW, which may take more than 10 hours.

A much faster option is to pump the vacuum chamber VC down to a temperature stabilizing pressure range which may be between the about 500-0.01 mbar, preferably between the about 50-0.1 mbar and more preferably between the about 10-0.1 mbar. Most of the cooling down by adiabatic expansion has then already occurred and there is enough medium in the vacuum chamber VC to allow for temperature stabilization by convection. This may allow the pressure within the vacuum chamber to be kept within the temperature stabilizing pressure range for a relatively short period, for example about 1 to 2 hours so as to stabilize the temperature in the vacuum chamber VC. The next step will be a further decreasing of the pressure within the vacuum chamber VC to a production pressure range so that production can be started. The production pressure range may be below about 0.2 mbar, between about 0.1 and about 0.01 mbar or even below about 0.001 mbar if the main gas is hydrogen. If the main gas is Helium or Argon, the pressure may be 10 times lower so that production may start at around about 0.01 mbar.

Mirrors in the projection system of an EUV lithographic apparatus are subjected to carbon contamination. The carbon contamination may arise from EUV or plasma induced dissociation of hydrocarbons being absorbed onto the mirrors from the residual background environment. Although carbon contamination may be minimized by keeping the vacuum environment clean from hydrocarbons as much as possible, it is difficult to totally remove the hydrocarbons. The carbon on the mirrors can be removed by oxidation or hydrogenation of the carbon with reactive oxygen or hydrogen radicals so that gaseous carbon-oxides or hydrocarbons are produced which may be pumped away. For this reaction, hydrogen or oxygen may be activated by an electron source, a hot wire or a radio frequency (RF) discharge generator that uses an appropriate mixture of hydrogen and noble gas or oxygen and a noble gas to produce hydrogen and oxygen radicals. As an alternative for hydrogen and oxygen, nitrogen, nitrogen oxide, carbon oxide (CO) and water have also been investigated for the forming of radicals that may react with carbon to form a gaseous product. A disadvantage of cleaning is that it may cause a considerable heat load to the mirrors, which may cause the mirrors to heat up with more than 10 degrees Celsius and consequently deform. It may therefore be necessary to cool the mirrors down after cleaning. Since cleaning will be done in vacuum and heat is not easily transported in vacuum, it may be advantageous to bring the pressure within the vacuum chamber VC to a temperature stabilizing pressure range after cleaning. It may be desirable to increase the pressure for this purpose and subsequently the pressure should be kept within the temperature stabilizing pressure range for a period of time so as to stabilize the temperature of the mirrors in the vacuum chamber. After the temperature is stabilized, the pressure may be decreased to a production pressure range and the lithographic apparatus may be used for the exposure of substrates.

A method according to the invention can be embodied as dedicated electronic hardware provided to the vacuum control system, or can be embodied in software, for example, each step of the method being a module or subroutine of a longer piece of computer code. Where the invention is embodied in software, an embodiment of the invention can comprise a computer program executed on a computer system provided to the vacuum control system VCS. The computer system may be any type of computer system executing a computer program written in any suitable language on a processor. The computer program may be stored on a computer-readable medium, which may be of any type, for example: a recording medium, such as a disc-shaped medium insertable into a drive of the computer system, and which may store information magnetically, optically or magneto-optically; a fixed recording medium of the computer system such as a hard drive; or a solid-state computer memory.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A device manufacturing method comprising:
    bringing pressure within a vacuum chamber of a lithographic projection apparatus to a temperature stabilizing pressure range;
    keeping the pressure within the vacuum chamber within the temperature stabilizing pressure range for a period of time so as to stabilize the temperature in the vacuum chamber;
    decreasing the pressure within the vacuum chamber to a production pressure range;
    generating a beam of radiation with a radiation system;
    patterning the beam of radiation; and
    projecting the patterned beam of radiation through the vacuum chamber onto a target portion of a layer of radiation-sensitive material on a substrate.

2. The method according to claim 1, wherein said bringing the pressure within the vacuum chamber to the temperature stabilizing pressure range comprises pumping down the pressure from normal atmospheric pressure to the temperature stabilizing pressure range.

3. The method according to claim 1, wherein the method further comprises cleaning a mirror of the radiation system or the projection system with a gas.

4. The method according to claim 3, wherein bringing the pressure within the vacuum chamber to the temperature stabilizing pressure range comprises increasing the pressure in the vacuum chamber from a cleaning pressure to the temperature stabilizing pressure range.

5. The method according to claim 1, wherein the vacuum chamber is kept at a temperature stabilizing pressure range during a period of more than ten minutes.

6. The method according to claim 1, wherein the temperature stabilizing pressure range is about 500-0.1 mbar.

7. The method according to claim 6, wherein the temperature stabilizing pressure range is about 50-0.2 mbar.

8. The method according to claim 7, wherein the temperature stabilizing pressure range is about 10-0.2 mbar.

9. The method according to claim 1, wherein the production pressure range is below about 0.2 mbar.

10. The method according to claim 9, wherein the production pressure range is between about 0.1 and about 0.01 mbar.

11. The method according to claim 1, further comprising purging the vacuum chamber with a purge gas.

12. The method according to claim 11, wherein the purge gas comprises Helium, Hydrogen, Nitrogen, Argon, or a mixture thereof.

13. The method according to claim 1, wherein said generating the beam of radiation is done when the pressure is in the production pressure range.

14. A device manufactured in accordance with the method of claim 1.

15. A computer readable medium storing a computer program comprising computer-executable code that when executed on a computer provided to a vacuum control system of a lithographic apparatus system causes the lithographic apparatus to perform a method according to claim 1.

16. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    a vacuum chamber constructed and arranged to provide a vacuum beam path to the radiation beam, the vacuum chamber being provided with a pump configured to evacuate the vacuum chamber, a purge system configured to purge the vacuum chamber, and a vacuum control system configured to control the pump and the purge system, wherein the vacuum control system is configured to control a pump down sequence of the vacuum chamber and to provide a pause in pumping down the vacuum chamber from atmospheric pressure to a production pressure range at a temperature stabilizing pressure range.

17. A lithographic apparatus according to claim 16, wherein the vacuum control system is configured to control the pump down sequence of the vacuum chamber with a computer readable medium configured to store a program that is run on a computer provided to the vacuum control system.

18. A lithographic apparatus according to claim 17, wherein the program when run on the computer provides the pause in pumping down the vacuum chamber from atmospheric pressure to the production pressure range at the temperature stabilizing pressure range.

19. A lithographic apparatus according to claim 18, wherein the temperature stabilizing pressure range is about 500-0.1 mbar.

20. A lithographic apparatus according to claim 19, wherein the temperature stabilizing pressure range is about 50-0.2 mbar.

21. A lithographic apparatus according to claim 20, wherein the temperature stabilizing pressure range is about 10-0.2 mbar.

22. A lithographic projection apparatus according to claim 18, wherein the production pressure is below about 0.2 mbar.

23. A lithographic apparatus according to claim 16, wherein the purge system is constructed and arranged for providing a purge gas comprising Helium, Hydrogen, Nitrogen, Argon or a mixture thereof.

24. A lithographic apparatus according to claim 16, further comprising a cleaning unit constructed and arranged to clean mirrors of the radiation system or the projection system, wherein the vacuum control system is configured to control the pressure of the vacuum chamber with a computer readable medium configured to store a program that is configured to be run on a computer, and wherein the program when run on the computer is configured to provide an increase of the pressure in the vacuum chamber after cleaning of the mirrors to a temperature stabilizing pressure range.

25. A lithographic projection apparatus according to claim 24, wherein the temperature stabilizing pressure range is about 500-0.1 mbar.

26. A lithographic projection apparatus according to claim 25, wherein the temperature stabilizing pressure range is about 50-0.2 mbar.

27. A lithographic projection apparatus according to claim 26, wherein the temperature stabilizing pressure range is about 10-0.2 mbar.

28. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate;
a vacuum chamber constructed and arranged to provide a vacuum beam path for the radiation beam, the vacuum chamber being provided with a pump configured to evacuate the vacuum chamber, a purge system configured to purge the vacuum chamber, and a vacuum control system configured to control the pump and the purge system; and
a cleaning unit constructed and arranged to clean mirrors of the radiation system and/or the projection system, wherein the vacuum control system is configured to control the pressure of the vacuum chamber and to provide an increase in pressure in the vacuum chamber after cleaning of the mirrors to a temperature stabilizing pressure range.

29. A lithographic projection apparatus according to claim 28, wherein the temperature stabilizing pressure range is about 500-0.1 mbar.

30. A lithographic projection apparatus according to claim 29, wherein the temperature stabilizing pressure range is about 50-0.2 mbar.

31. A lithographic projection apparatus according to claim 30, wherein the temperature stabilizing pressure range is about 10-0.2 mbar.

* * * * *